(12) United States Patent
Gammie et al.

(10) Patent No.: US 7,307,471 B2
(45) Date of Patent: Dec. 11, 2007

(54) ADAPTIVE VOLTAGE CONTROL AND BODY BIAS FOR PERFORMANCE AND ENERGY OPTIMIZATION

(75) Inventors: Gordon Gammie, Plano, TX (US);
Alice Wang, Richardson, TX (US);
Uming U. Ko, Plano, TX (US); David B. Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/213,477

(22) Filed: Aug. 26, 2005

(65) Prior Publication Data

US 2007/0046362 A1    Mar. 1, 2007

(51) Int. Cl.
*G05F 1/565* (2006.01)
(52) U.S. Cl. .................. 327/544; 327/541; 700/298
(58) Field of Classification Search ............. None
See application file for complete search history.

(56) References Cited

U.S. PATENT DOCUMENTS

| | | | |
|---|---|---|---|
| 6,657,467 B2* | 12/2003 | Seki et al. ............ | 327/158 |
| 7,061,292 B2* | 6/2006 | Maksimovic et al. ..... | 327/277 |
| 7,131,089 B2* | 10/2006 | Issa et al. ............... | 716/6 |
| 7,148,755 B2* | 12/2006 | Naffziger et al. ......... | 331/16 |
| 2006/0091385 A1* | 5/2006 | Mair et al. .............. | 257/49 |

OTHER PUBLICATIONS

Mair, Hugh Thomas et al., U.S. Appl. No. 11/045,222, filed on Jan. 28, 2005, entitled, "Adaptive Voltage Control For Performance And Energy Optimization," 19 pages including 3 pages of Formal Drawings.

* cited by examiner

*Primary Examiner*—Kenneth B. Wells
*Assistant Examiner*—Terry L. Englund
(74) *Attorney, Agent, or Firm*—Ronald O. Neerings; Wade James Brady, III; Frederick J. Telecky, Jr.

(57) ABSTRACT

A device for adaptively controlling a voltage supplied to circuitry in close proximity to the device, comprising a processing module and a first tracking element coupled to the processing module. The first tracking element produces a first value indicative of a first estimated speed associated with the circuitry. The device also comprises a second tracking element coupled to the processing module. The second tracking element produces a second value indicative of a second estimated speed associated with the circuitry. The processing module compares each of the first and second values to respective target values and causes a voltage output to be adjusted based on the comparisons. The first and second tracking elements comprise a plurality of transistors, at least some of the transistors selectively provided with a transistor bias voltage to adjust transistor speed.

26 Claims, 8 Drawing Sheets

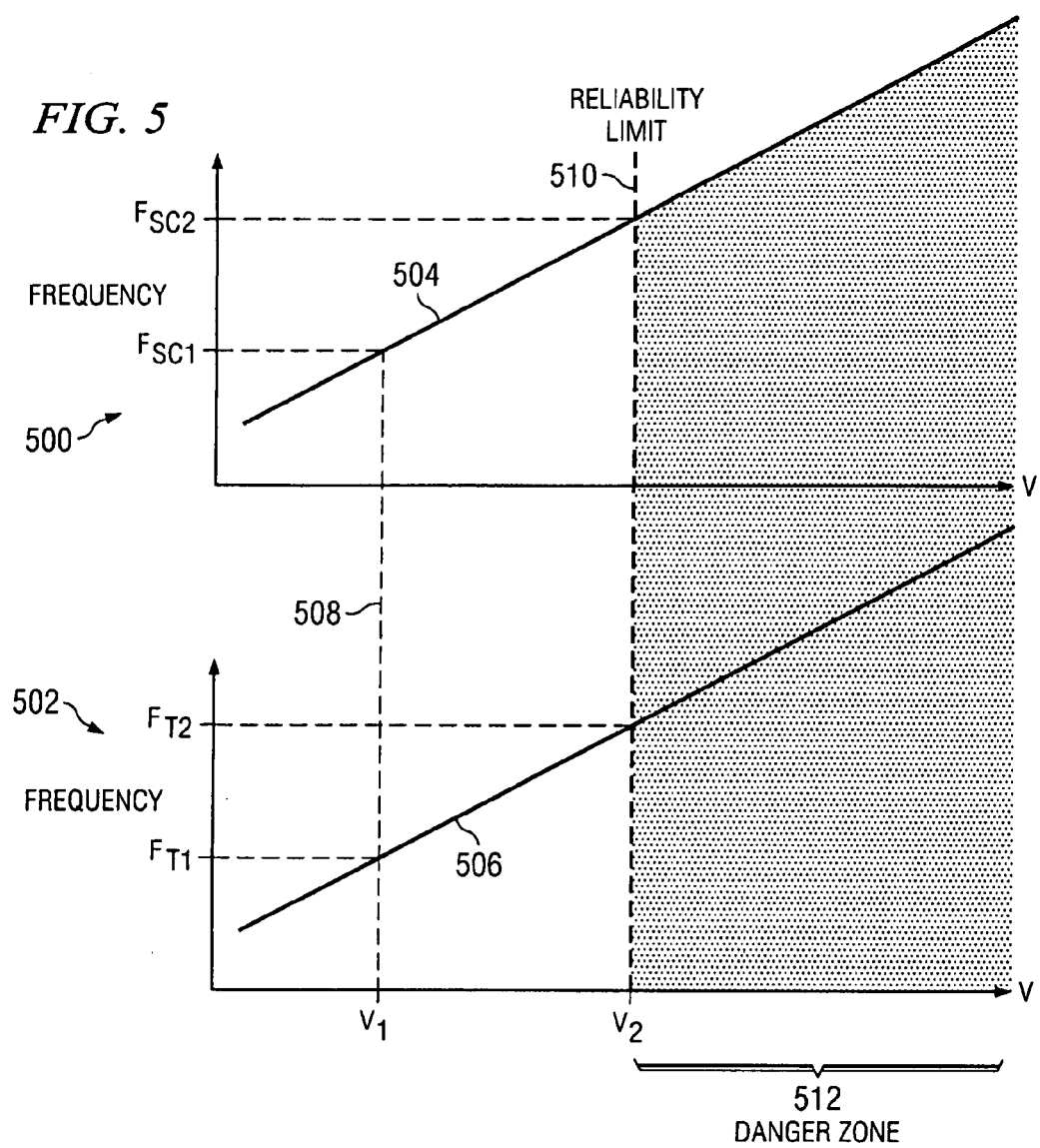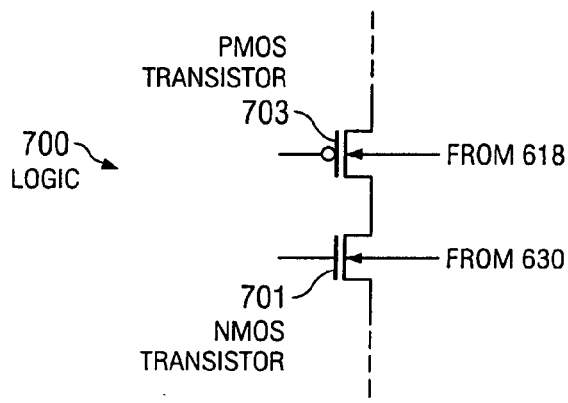

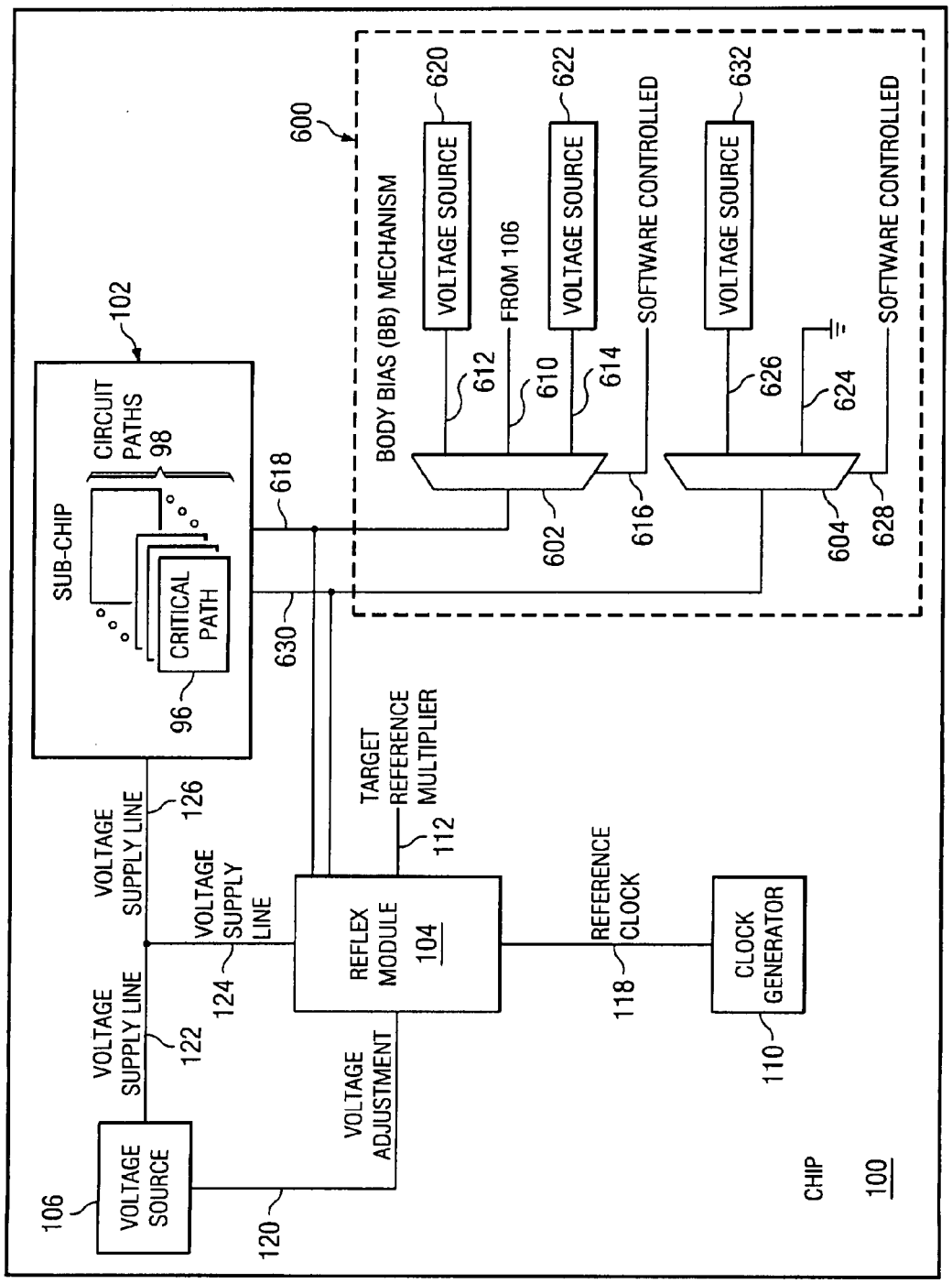

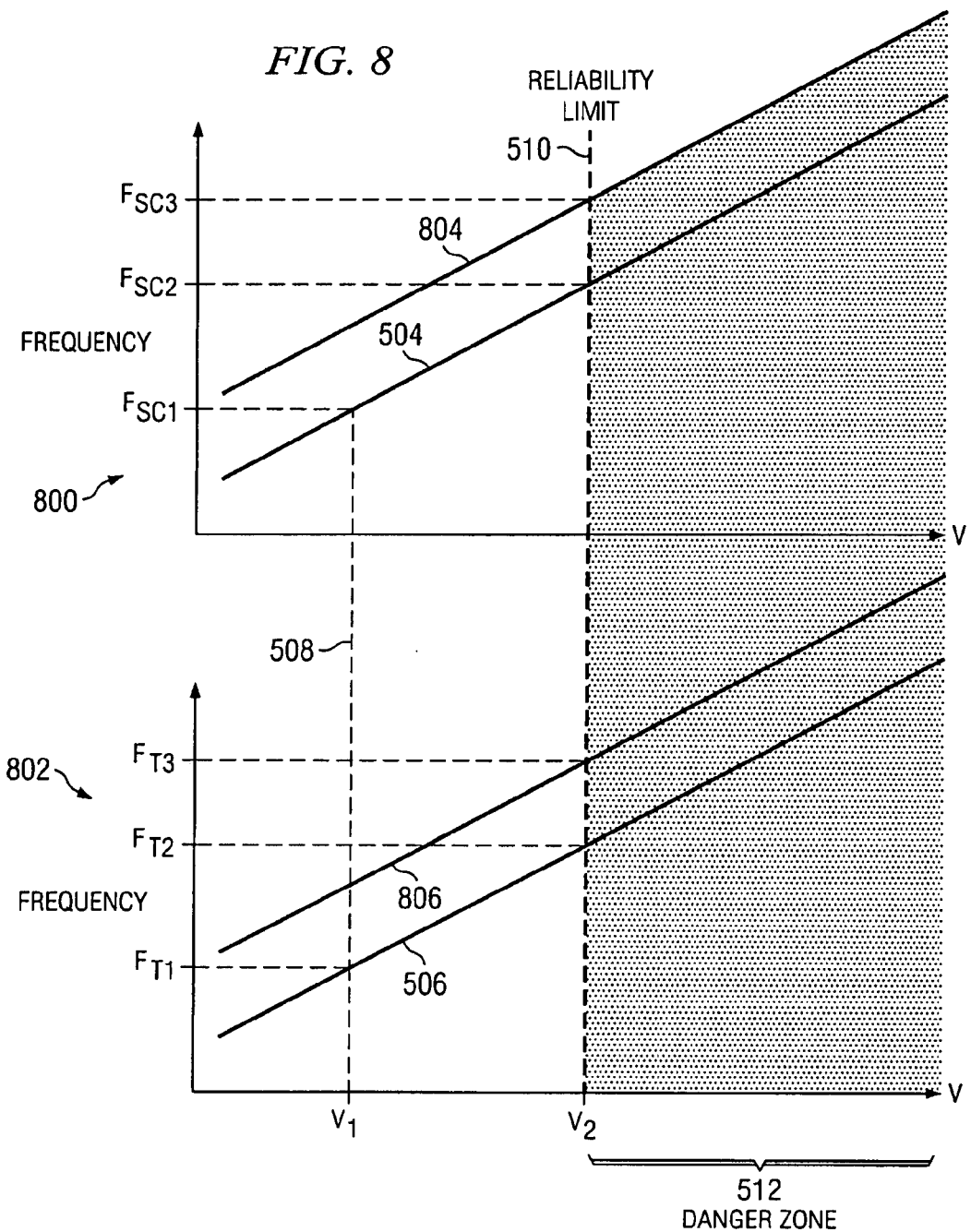

ADAPTIVE VOLTAGE CONTROL AND BODY BIAS FOR PERFORMANCE AND ENERGY OPTIMIZATION

CROSS-REFERENCE TO RELATED APPLICATIONS

This application may contain subject matter related to the commonly assigned, co-pending application entitled, "Adaptive Voltage Control for Performance and Energy Optimization," having Ser. No. 11/045,222, filed Jan. 28, 2005, and incorporated herein by reference.

BACKGROUND

A load (e.g., a chip) may comprise a plurality of circuit paths. A "circuit path" may be interpreted to mean arrangements of electronic circuitry through which current may flow. Each path generally comprises a plurality of transistors. In some cases, each path may be designed to perform a specific function. One of these paths may be the most poorly-performing (i.e., slowest) path, due to any of a variety of reasons, such as circuit complexity. The circuit path that limits the overall performance frequency of other circuit paths and/or the load itself may be termed the "critical path."

Any of a variety of factors, such as temperature, voltage, manufacturing variation and other factors not specifically disclosed herein may affect the speed of the critical path, as well as that of any of the other circuit paths. For example, because the voltage supplied to a circuit path is applied to some or all of the transistors in the circuit path, the voltage dictates, at least in part, the performance of the transistors in the path. In turn, the performance of the transistors dictates, at least in part, the speed of the circuit path itself. Thus, if a voltage that is delivered to a circuit path is undesirably high or low (i.e., the voltage has been substantially altered by various circuit components and phenomena between a voltage source and the circuit path), the performance speed of the circuit path may likewise be undesirably high or low.

In some cases, such factors may impact the speed of the critical path and/or another path such that the speed of the path may become excessively low or excessively high. If the speed becomes excessively low, the path and/or the load may cease to function. Conversely, if the speed becomes excessively high, the chip and/or the load may waste power or even become damaged.

SUMMARY

The problems noted above are solved in large part by a method and apparatus of adaptive voltage control and body bias for performance and energy optimization. At least one embodiment may be a device for adaptively controlling a voltage supplied to circuitry in close proximity to the device, comprising a processing module and a first tracking element coupled to the processing module. The first tracking element produces a first value indicative of a first estimated speed associated with the circuitry. The device also comprises a second tracking element coupled to the processing module. The second tracking element produces a second value indicative of a second estimated speed associated with the circuitry. The processing module compares each of the first and second values to respective target values and causes a voltage output to be adjusted based on the comparisons. The first and second tracking elements comprise a plurality of transistors, at least some of the transistors selectively provided with a transistor bias voltage to adjust transistor speed.

Another illustrative embodiment may be a chip comprising a circuit that includes a plurality of circuit paths and receives a voltage from a voltage source. The chip also comprises a module external to the circuit, coupled to the voltage source, and comprising a first tracking element and a second tracking element. The module is subjected to substantially similar operating conditions as the circuit. The module adjusts a voltage source output based on a value generated by at least one of the first and second tracking elements. The circuit paths and the first and second tracking elements comprise a plurality of transistors, at least some of the transistors selectively provided a transistor bias voltage to adjust speeds of the at least some of the transistors.

Yet another illustrative embodiment may be a method comprising determining a first frequency ratio of a first tracking element frequency to a first target reference frequency, determining a second frequency ratio of a second tracking element frequency to a second target reference frequency and, based on the frequency ratios, adjusting the voltage that is output by a voltage source to a circuit associated with the tracking elements. The first and second tracking elements comprise a plurality of transistors, at least some of the transistors selectively provided with a transistor bias voltage to adjust speeds of the at least some of the transistors.

BRIEF DESCRIPTION OF THE DRAWINGS

For a detailed description of exemplary embodiments of the invention, reference will now be made to the accompanying drawings in which:

FIG. 5 shows two interrelated graphs illustrating a relationship between the voltage vs. operational frequency of the reflex module, and the voltage vs. operational frequency of circuit logic adjacent to the reflex module, in accordance with embodiments of the invention;

FIG. 6 shows the block diagram of FIG. 1 modified with forward body bias and reverse body bias capability, in accordance with a preferred embodiment of the invention;

FIG. 7 shows a diagram of two transistors with body bias capability, in accordance with a preferred embodiment of the invention;

FIG. 8 shows two interrelated graphs illustrating the performance benefits obtained by implementing the circuitry shown in FIG. 6, in accordance with embodiments of the invention.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a "reflex" module that may be implemented within any chip (i.e., load) or circuit system to compensate for at least one of the various factors that adversely affect the speed of a circuit path (e.g., critical path) on the chip. By compensating for these factors, the reflex module enables the circuit path (and thus the chip) to maintain a predetermined speed of operation, or at least maintain the speed within a desired range. For instance, the reflex module may react to a change in ambient temperature. Recognizing that a change in ambient temperature may potentially cause the speed of a circuit path such as the critical path to be altered to an undesirable level, the reflex module may adjust the voltage supply accordingly. In this way, a desirable circuit path speed is maintained and the chip is prevented from consuming excess power and/or from suffering a loss in performance. The reflex module preferably is not application-specific. As such, the reflex module may be considered generic and may be used within any circuit architecture without a need for substantial modification.

Figure 1:
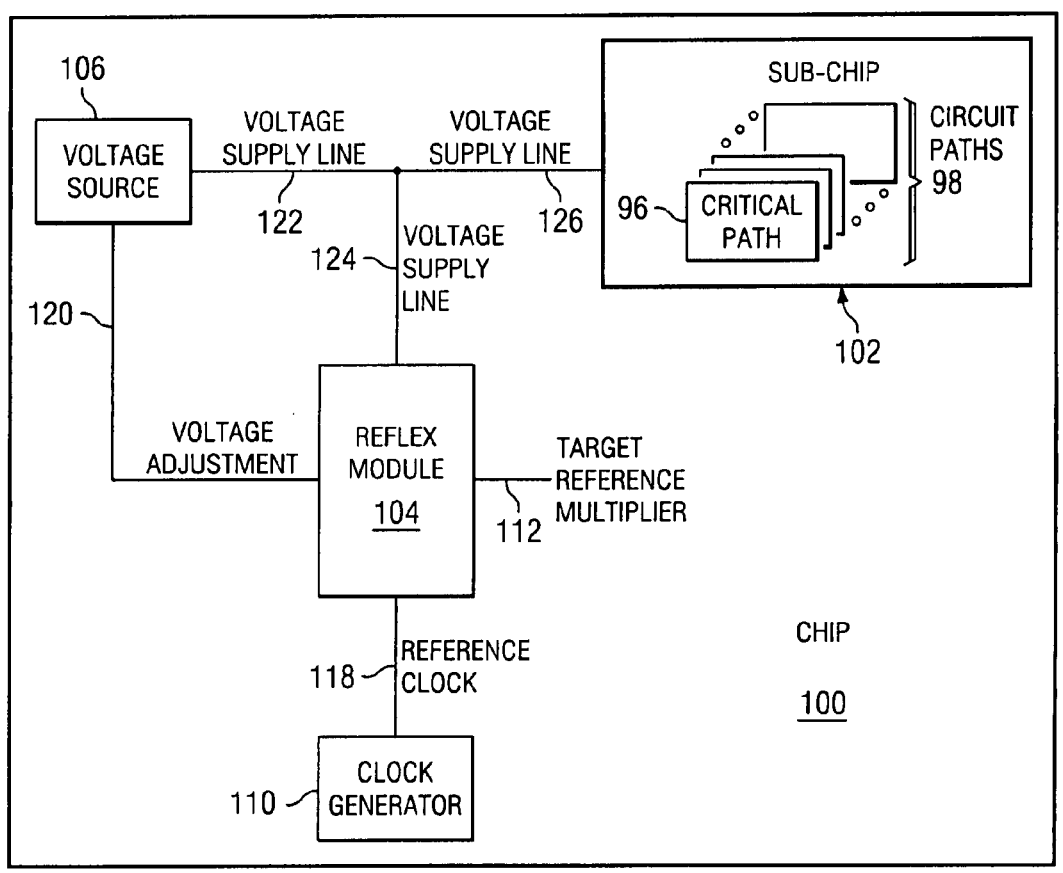
FIG. 1 shows a block diagram of a chip having a voltage source, a sub-chip comprising multiple circuit paths, one of which is a critical path, and a "reflex" module, wherein the reflex module adaptively controls the voltage supplied to the sub-chip, in accordance with a preferred embodiment of the invention.

FIG. 1 shows an exemplary embodiment of a chip 100 comprising such a reflex module. Specifically, in at least some embodiments, the chip 100 comprises a voltage source 106, a "sub-chip" 102 comprising circuit paths 98, a reflex module 104 and a clock generator 110. The voltage source 106 and the clock generator 110 are not necessarily located on the chip 100. The sub-chip 102 may be any portion of the circuitry of the chip 100 and may perform some specific function. The sub-chip 102 also may be a chip that is separate from the chip 100, wherein the sub-chip 102 is stacked upon the chip 100. The circuit paths 98 preferably comprise a critical path 96 of the sub-chip 102. The circuit paths 98 also may comprise any other path of circuitry on the sub-chip 102. The circuit paths 98, including the critical path 96, may comprise a plurality of transistors arranged in a predetermined format. The voltage source 106 supplies voltage to the sub-chip 102 by way of voltage supply lines 122, 126 and to the reflex module 104 by way of voltage supply lines 122, 124. The reflex module adaptively controls the voltage output of the voltage source 106 by sending signals to the voltage source 106 via voltage adjustment 120. The clock generator 110 supplies to the reflex module 104 a reference clock signal 118. The reflex module 104 also is supplied with a target reference multiplier (TRM) signal 112, which is used as described further below.

The TRM 112 may be a value selected by a manufacturer or some other entity. The TRM 112 is used by the reflex module 104 to estimate whether one of the circuit paths 98, preferably the critical path 96, is performing at an acceptable speed. More specifically, in at least some embodiments, the TRM 112 is multiplied by the reference clock 118 frequency to produce a target reference frequency (TRF) 113 (not shown). The reflex module 104 uses the TRF 113 to determine whether the critical path 96 is performing at an acceptable speed. If it is determined that the circuit path 98 of concern is currently or may soon be performing at an undesirably high or low speed (i.e., in relation to the TRF 113), then the reflex module 104 may adjust the voltage output of the voltage source 106 accordingly. This may be accomplished by reducing voltage output if the circuit path(s) 98 is performing at too high a speed or increasing voltage output if the circuit path(s) 98 is performing at too low a speed. By adjusting the voltage supplied to the circuit paths 98, some or all of the circuit paths 98 (e.g., critical path 96) may be manipulated to perform at a speed closer to a desired speed (e.g., the speed of the TRF 113). Thus, the TRM 112 (effectively the TRF 113) may be assigned a value as desired and may be used to deliberately increase or decrease the speed of the circuit path 98 (e.g., critical path 96), thus boosting performance of the circuit path(s) 98, the sub-chip 102 and/or the chip 100, or diminishing power consumption by the circuit path(s) 98, the sub-chip 102 and/or the chip 100. Although only one TRM 112 is shown, any number of TRMs may be used.

For example, in cases where excessive power consumption is a substantial concern, the TRM 112 may be assigned a considerably low value. The reflex module 104 may multiply the TRM 112 by the reference clock 118 frequency to produce a TRF 113. The reflex module 104 then may essentially compare the TRF 113 against the speed at which the critical path 96 (or any circuit path 98) may be performing, although such comparison is not a direct comparison, as described in context of FIG. 2 below. If the critical path 96 is surmised to be performing at a speed higher than the TRF 113, the reflex module 104 may cause the voltage supplied to the critical path 96 by the voltage source 106 to be decreased. Because the voltage supplied to the critical path 96 is decreased, the speed at which the critical path 96 performs also is decreased, preferably to the TRF 113 or within some predetermined range including the TRF 113. The precise technique used by the reflex module 104 to surmise the speed of the critical path 96 is described in detail below.

Figure 2:
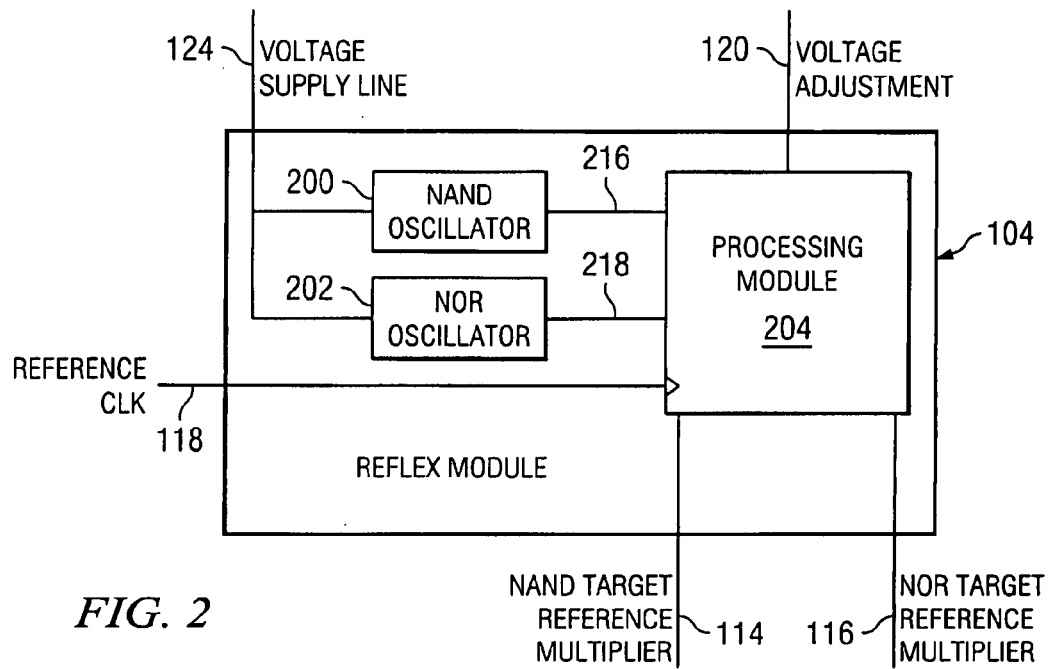
FIG. 2 shows a detailed view of the reflex module of FIG. 1, in accordance with a preferred embodiment of the invention.

FIG. 2 shows an exemplary embodiment of the aforementioned reflex module 104. Specifically, FIG. 2 shows the reflex module 104 comprising, among other things, a NAND oscillator 200, a NOR oscillator 202 and a processing module 204. The NAND oscillator 200 courles to the processing module 204 by way of a connection 216 and the NOR oscillator 202 couples to the processing module 204 by way of a connection 218. A NAND oscillator 200 is preferably used because the NAND oscillator is most sensitive to Negative Channel Metal Oxide Semiconductors (NMOS) and less sensitive to Positive Channel Metal Oxide Semiconductors (PMOS). However, any other suitable logic oscillator, or even any other suitable device capable of performing at least some functions of the NAND oscillator 200 as described below, may be used. The precise function of the NAND oscillator 200 is described in detail below. Likewise, the NOR oscillator 202 is preferably used because the NOR oscillator is most sensitive to PMOS and less sensitive to NMOS. However, any other suitable logic oscillator, or even any other suitable device capable of performing at least some functions of the NOR oscillator 202 as described below, may be used. The precise function of the NOR oscillator 202 is described in detail below. The processing module 204 is supplied with the reference clock signal 118 shown in FIG. 1. The processing module 204 also is supplied with a NAND target reference multiplier (TRM) 114 and a NOR target reference multiplier (TRM) 116, each of which has a function similar to that of the TRM 112 of FIG. 1. Although only two input reference signals 114, 116 are shown, any number of input reference signals may be used.

Figure 3A:
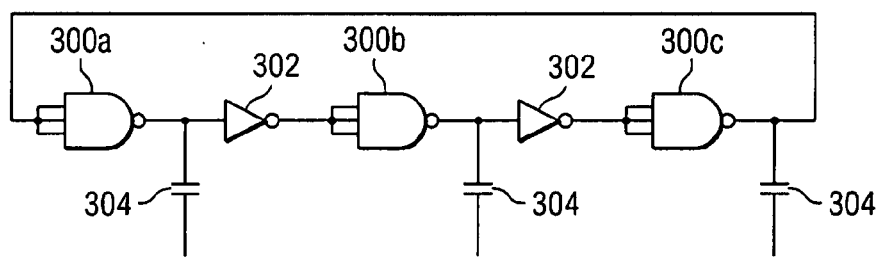
FIG. 3a shows a circuit schematic of a NAND oscillator within the reflex module of FIG. 2, in accordance with a preferred embodiment of the invention.
Figure 3B:
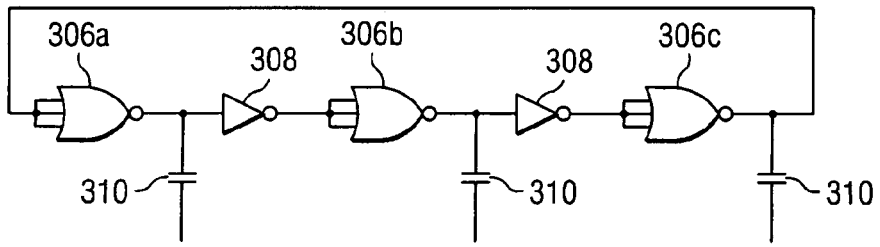
FIG. 3b shows a circuit schematic of a NOR oscillator within the reflex module of FIG. 2, in accordance with a preferred embodiment of the invention.

As shown in FIG. 3a, the NAND oscillator 200 comprises in one embodiment an arrangement of NAND gates 300a-300c, inverters 302, and capacitors 304. The output of the NAND gate 300c is fed back to the input of the NAND gate 300a, thus creating a feedback loop that causes the NAND oscillator 200, when provided a voltage by the voltage source 106, to oscillate at a certain frequency. Although only three NAND gates 300 are shown, any number of NAND gates, inverters, capacitors, and any other suitable circuitry may be used. Similarly, in a preferred embodiment, FIG. 3b shows a NOR oscillator 202 comprising an arrangement of NOR gates 306a-306c, inverters 308, and capacitors 310. The output of the NOR gate 306c is fed back to the input of the NOR gate 306a, thus creating a feedback loop that causes the NOR oscillator 202, when provided a voltage by the voltage source 106, to oscillate at a certain frequency. Although only three NOR gates 306 are shown, any number of NOR gates, inverters, capacitors and any other suitable circuitry may be used. Because the NAND oscillator 200 and the NOR oscillator 202 are not application-specific, they may be considered generic and may be used in any suitable device or circuit architecture. Other circuitry that performs functions similar to those of the oscillator as described below may, in some embodiments, be used instead of one or more of the oscillators. This other circuitry, as well as the oscillators, may generally be referred to as "tracking elements."

As described above, one function of the reflex module 104 is to anticipate how various conditions (e.g., temperature, ripple effects, and others as described above and/or those not specifically set out herein) may affect the speed of the critical path 96 (or any circuit path 98) and to adjust the voltage output of the voltage source 106 accordingly, so as to maintain a predetermined speed of the critical path 96 (or another circuit path 98). The reflex module 104 anticipates such speed changes of the critical path 96 or another circuit path 98 by using the NAND oscillator 200 and the NOR oscillator 202, as described below.

The reflex module 104 preferably is placed in close proximity to the critical path 96 and/or the sub-chip 102 (e.g., within 1 mm, within 5 mm, or any other suitable distance). The reflex module's proximity to the critical path 96 is at least sufficiently close so that the reflex module 104 and the contents thereof are subjected to some or all of the same environmental influences as the critical path 96. For example, an increase in internal temperature or external temperature may affect the critical path 96 and the reflex module 104 equally or at least to a similar degree. The NAND oscillator 200 and the NOR oscillator 202 are used to anticipate speed changes along the critical path 96 under the assumption that under substantially similar environmental conditions, the frequency of the NAND oscillator 200 (which is primarily sensitive to NMOS, meaning that it simulates performance of the NMOS in the critical path 96 under similar performance conditions) and the frequency of the NOR oscillator 202 (which is primarily sensitive to PMOS, meaning that it simulates performance of the PMOS in the critical path 96 under similar conditions) will be indicative of the worst-possible performances of the critical path 96. If other tracking elements are used instead of the oscillators, those tracking elements may simulate the worst-case performance of at least a portion of the critical path 96, given that the critical path 96 and the tracking elements are subjected to substantially similar operating conditions and/or environmental influences.

That is, various aforementioned factors (e.g., temperature) may affect both the NAND and NOR oscillators, but each to a different degree. As such, the NAND and NOR oscillators each can represent the worst-case performance scenarios of the critical path 96, since the NAND oscillator 200 represents the performance of the critical path 96 if the path 96 were comprised of primarily NMOS, and the NOR oscillator 202 represents the performance of the critical path 96 if the path 96 were comprised of primarily PMOS. However, in reality, the critical path 96 is likely to be comprised of both NMOS, PMOS and other circuitry. Thus, the actual speed of the critical path 96 is likely to be greater than the frequencies of the NAND and NOR oscillators 200, 202. Thus, by ensuring that the frequencies of the NAND and NOR oscillators 200, 202 never fall outside a predetermined frequency range, the speed of the critical path 96 will be virtually guaranteed to be within a desired range as well.

Again, more specifically, the critical path 96 may be of any suitable architectural design. However, regardless of the precise design or the quality of the silicon used to fabricate the critical path 96, the speed of the critical path 96 will be greater than that of the NAND oscillator 200 and the NOR oscillator 202. This is because the NAND oscillator 200 is represented by the arrangement of NMOS-sensitive NAND gates shown in FIG. 3a, thus representing one possible worst-case performance scenario. The NOR oscillator 202 is represented by the arrangement of PMOS-sensitive NOR gates shown in FIG. 3b, thus representing the other possible worst-case performance scenario. However, the critical path 96, in most practical cases, may likely be a combination of NMOS, PMOS, and/or other types of circuitry, thus making the critical path 96 less sensitive to environmental influences than the NAND and NOR oscillators 200, 202. As such, the actual performance of the critical path 96 is better than both of the worst-case performance scenarios given by the NAND oscillator 200 and the NOR oscillator 202. Thus, even if the critical path 96 is comprised of NMOS and no PMOS, the performance of the critical path 96 will be accurately predicted by the NAND oscillator 200. Conversely, if the critical path 96 is comprised of PMOS and no NMOS, the performance of critical path 96 will be accurately predicted by the NOR oscillator 202. Regardless of the precise circuitry of the critical path 96, the speed of the critical path 96 will be superior to that of the NAND oscillator 200 and the NOR oscillator 202. The same concepts would apply if other tracking elements were used instead of one or more of the oscillators.

By using the oscillation frequencies of the NAND oscillator 200 and the NOR oscillator 202 to anticipate the worst-case performance of the critical path 96, the reflex module 104 is able to adjust the voltage supplied by the voltage source 106 accordingly and to maintain a steady level of performance for the critical path 96. More specifically, by monitoring and reacting to worst-case performance scenarios for the critical path 96 (i.e., monitoring the NAND and NOR oscillators), the actual speed (i.e., performance) of critical path 96 is likely to be at an acceptable level and may not need to be monitored. For example, if various environmental conditions cause the NAND oscillator 200 to begin to perform poorly (i.e., at a lower-than-necessary frequency), the reflex module 104 may increase the voltage output of the voltage source 106, thus increasing the speed of the critical path 96. In this way, even though the critical path 96 may not yet have been suffering from excessively low speed, the NAND oscillator 200, which was simulating the worst-case speed of the critical path 96, alerted the reflex module 104 to such a possibility. In turn, the reflex module 104 prevented such an occurrence by taking the necessary precaution of increasing voltage output to the critical path 96. Accordingly, a drop in speed of the critical path 96 was avoided.

As previously explained, the reflex module 104 is generic and independent of the sub-chip 102 or the contents thereof. As such, the reflex module 104 surmises or estimates the speed of the critical path 96 using the oscillating frequencies of the NAND and NOR oscillators 200, 202. The reflex module 104 uses the frequencies of the NAND oscillator 200 and the NOR oscillator 202 to adjust output voltage of the voltage source 106 as follows. First, the NAND and NOR TRMs 114, 116 are assigned values and are supplied to the processing module 204. The reference clock signal 118 also is input into the processing module 204. The processing module 204 multiplies the reference clock signal 118 frequency by each of the multipliers 114, 116 to produce NAND and NOR TRFs 115, 117, respectively (not shown). For example, under a given set of environmental influences, if the NAND TRM 114 has a value of 3 and the reference clock signal 118 is set at 32 kHz, then the NAND TRF 115 may be determined to be approximately 96 kHz (i.e., 32 kHz multiplied by 3). The TRF 115 then is compared to the NAND oscillator 200 oscillating frequency to obtain a NAND ratio. If, for example, the NAND oscillator 200 is oscillating at 960 kHz, then the NAND ratio is approximately 10 (i.e., 960 kHz divided by 96 kHz) and the NAND oscillator 200 is said to be oscillating at an excessively high frequency (i.e., the NAND ratio is greater than 1). Similarly, if the NOR TRM 116 is 2, and the reference clock signal 118 is set at 32 kHz, then the NOR TRF 117 is about 64 kHz (i.e., 32 kHz multiplied by 2). The TRF 117 then is compared to the NOR oscillator 202 frequency to obtain a NOR ratio. If, for example, the NOR oscillator 202 is oscillating at 128 kHz, then the NOR ratio is approximately 2 (i.e., 128 kHz divided by 64 kHz) and the NOR oscillator 202 is said to be oscillating at too high a frequency (i.e., the NOR ratio is greater than 1).

Because the performance frequencies of the NAND oscillator 200 and the NOR oscillator 202 are undesirably high, the critical path 96 speed also is higher than required and is wasting power. Accordingly, the processing module 204 may send a signal to the voltage source 106 that causes the voltage source 106 to decrease the voltage that is output by the voltage source 106. Thus, the voltage supplied to the critical path 96 by way of supply lines 122, 126 and to the reflex module 104 by way of supply lines 122, 124 may be decreased. In this way, because the voltage supplied to the critical path 96 (i.e., effectively, transistors within the critical path 96) is decreased, the speed of the critical path 96 also is decreased, thereby correcting or preventing an excessively high speed. Also, the decrease in voltage supplied to the reflex module 104 by way of supply lines 122, 124 may cause the NAND oscillator 200 and NOR oscillator 202 oscillating frequencies to fall, thus satisfying frequency ratio expectations (i.e., causing the ratios to be approximately 1 or within a predetermined range that includes 1). The reflex module 104 then may continue to monitor the aforementioned ratios to maintain a predetermined target speed for the critical path 96 and/or other circuit paths 98.

Another example of the operation of the reflex module 104 is as follows. If the reference clock signal 118 is 40 MHz, the NAND TRM 114 is 4, and the NOR TRM 116 is 2.5, then the NAND TRF 115 is 160 MHz (i.e., 40 MHz multiplied by 4) and the NOR TRF 117 is 100 MHz (I.e., 40 MHz multiplied by 2.5). Furthermore, if the NAND oscillator 200 is oscillating at 120 MHz, and the NOR oscillator 202 is oscillating at 80 MHz, then the NAND and NOR ratios may be approximately 0.75 (i.e., 120 MHz divided by 160 MHz) and 0.8 (i.e., 80 MHz divided by 100 MHz), respectively. In this case, the NAND and NOR oscillators are oscillating at an excessively low frequency (i.e., ratios are less than 1). Such a slow oscillation frequency indicates that the critical path 96 may also be performing at an excessively low speed, or may soon be performing at an excessively low speed. To eliminate or avoid this problem, the reflex module 104 may cause the voltage source 106 to increase the voltage that is transferred to critical path 96, thus increasing the speed of the critical path 96 to an acceptable level (e.g., until the processing module 204 determines that the NAND and NOR ratios are about 1 or within a predetermined range including 1).

Because the NAND TRM 114 and the NOR TRM 116 are variable, they can be used to manipulate the performance of the critical path 96. For example, the critical path 96 may have a certain speed. Any suitable entity (e.g., a human user, a computer program, a circuit switch) may adjust the TRM 114 and/or the TRM 116 to select a different reference multiplier, thus indirectly altering the TRFs 115, 117. For example, one or both of the TRMs 114, 116 may be raised to a level such that the corresponding TRFs 115, 117 are raised above the oscillating frequency of the NAND and NOR oscillator 200, 202. Because the NAND and NOR oscillators 200, 202 will be recognized by the processing module 204 as oscillating at too low a frequency (in comparison to the TRFs 115, 117), the processing module 204 will cause the voltage source 106 to increase its voltage output, thereby increasing the speed of the critical path 96. This same technique may be used to cause the critical path 96 to perform at a lower speed and save power. As previously mentioned, although only two target reference multipliers 114, 116 are shown at the processing module 204, any number of target signals may be used.

Figure 4:
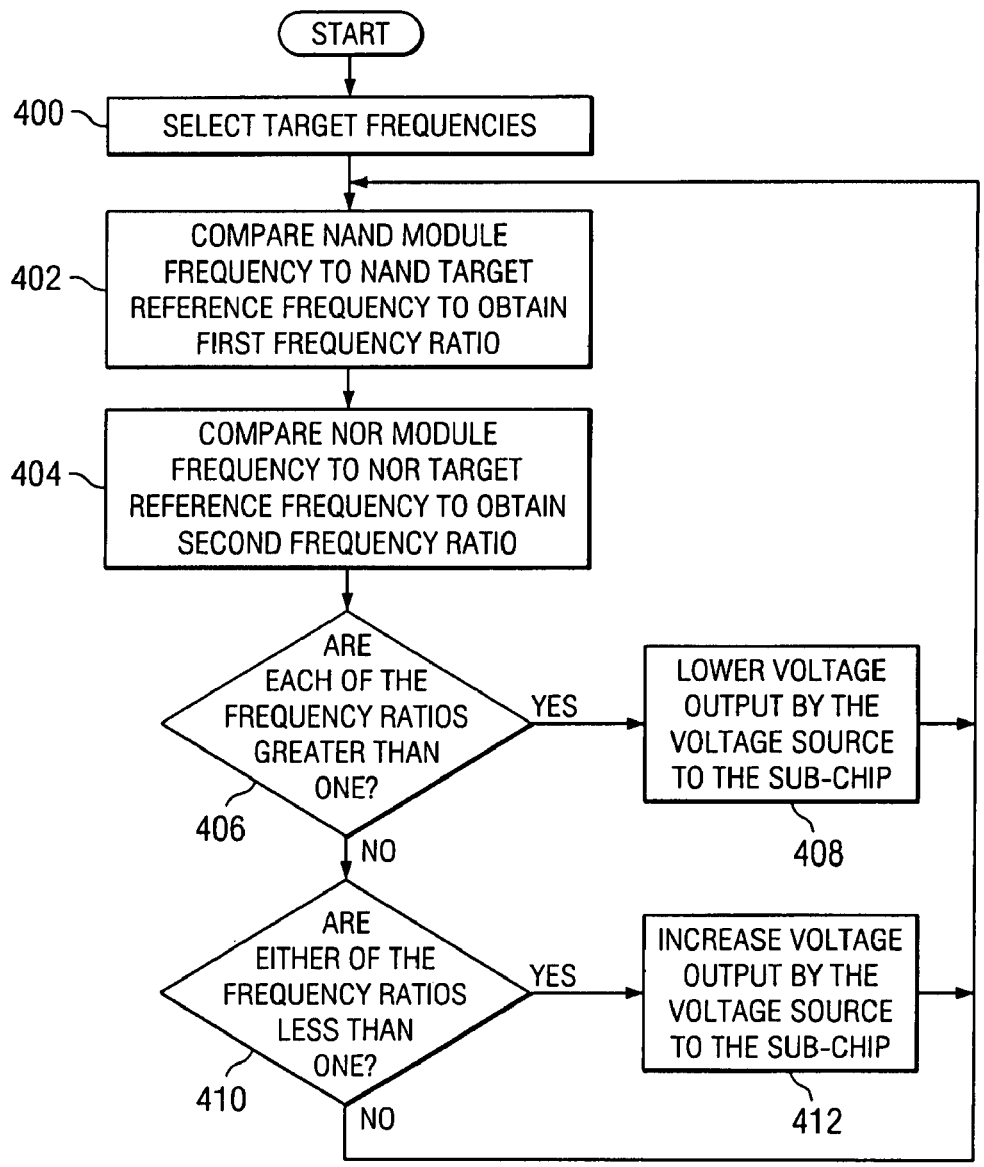
FIG. 4 shows a flow diagram describing the process used by the reflex module of FIG. 2 to adaptively adjust the voltage that is output by a voltage source to a sub-chip, in accordance with a preferred embodiment of the invention.

FIG. 4 shows a flow diagram describing the frequency comparison and voltage regulation process explained above. The process may begin by selecting desired target frequencies (block 400). This step involves receiving two target reference multipliers and multiplying them by the reference clock frequency to produce the target frequencies. The processing module 204 then may compare the oscillation frequency of the NAND oscillator 200 to the NAND target frequency to obtain a first frequency ratio (block 402), thus establishing one worst-case scenario. The processing module 204 also may compare the oscillation frequency of the NOR oscillator 202 to the NOR target frequency to obtain a second frequency ratio (block 404), thus establishing the other possible worst-case scenario. The processing module 204 then may determine whether each of the first and second frequency ratios is greater than approximately 1 (block 406). Although a comparison to 1 is preferred, values other than 1 also may be used. If both ratios are greater than approximately 1, then the voltage source output is reduced (block 408) and control returns to the block 402. However, if both ratios are not greater than approximately 1, then the processing module 204 determines if either of the first and second frequency ratios is less than approximately 1 (block 410). If either ratio is less than approximately 1, then the voltage output of the voltage source is increased (block 412) and control returns to block 402. Otherwise, if either of the frequency ratios is not less than approximately 1, then control is directly returned to block 402. In this way, the worst-case performance scenarios of the critical path 96 are constantly monitored, thereby ensuring that the actual speed of the critical path 96 matches the desired speed. The scope of disclosure is not limited to these particular steps, nor is the scope of disclosure limited to performing these steps in the order shown.

Shown in FIG. 5 are two graphs 500, 502. The graph 500 demonstrates the relationship between the voltage supplied to the sub-chip logic 102 and the operational frequency of the transistors on the sub-chip logic 102. As shown, a supplied voltage of $V_1$ results in an operational frequency of $F_{SC1}$. Similarly, a supplied voltage of $V_2$ results in an operational frequency of $F_{SC2}$. Line 504 shows the voltage-to-frequency relationship for a variety of supplied voltages.

The graph 502 demonstrates the relationship between the voltage supplied to the reflex module 104 (i.e., the same voltage provided to the sub-chip logic 102) and the target frequencies for the NAND and NOR oscillators in the reflex module 104. As shown, the supplied voltage of $V_1$ results in a target frequency of $F_{T1}$, while the supplied voltage of $V_2$ results in a target frequency of $F_{T2}$. Line 506 shows the voltage-to-target frequency relationship for a variety of supplied voltages.

Thus, referring simultaneously to graphs 500 and 502, the target frequency $F_{T1}$ at the reflex module 104 results in the operational frequency of $F_{SC1}$ at the sub-chip logic 102, as indicated by line 508. Similarly, the target frequency $F_{T2}$ at the reflex module 104 results in the operational frequency of $F_{SC2}$ at the sub-chip logic 102, as indicated by line 510. Transistors used in the sub-chip logic 102 and the reflex module 104 have an inherent reliability limit. This reliability limit is the point on the graphs 500, 502 that represents the maximum voltage that can be safely supplied to the transistors. Supplying a voltage exceeding the reliability limit may damage the transistors and other circuitry in the sub-chip logic 102 and/or the reflex module 104. Thus, because the voltage provided to the sub-chip logic 102 and the reflex module 104 cannot be safely increased past the reliability limit, the maximum frequency that can be safely achieved in the sub-chip logic 102 and the reflex module 104 is that which is achieved at the reliability limit. Performance of the sub-chip logic 102 and/or the reflex module 104 cannot be safely increased beyond this point.

Still referring to the graphs 500, 502 of FIG. 5, an exemplary reliability limit is indicated by line 510. While providing a voltage higher than $V_2$ to the sub-chip logic 102 and the reflex module 104 may result in increased performance (i.e., increased frequency) of the sub-chip logic 102 and the reflex module 104, the sub-chip logic 102 and the reflex module 104 would be operating in a "danger" zone 512, in that the sub-chip logic 102 and the reflex module 104 would be subject to damage at any time. This "danger" zone 512 is indicated on the graphs 500, 502 with hash marks.

Although it is undesirable to operate in the danger zone 512 due to the risk of damage, it is still desirable to increase the target frequency of the reflex module 104 (and thus the operational frequency of the sub-chip logic 102) without increasing the voltage supplied by the voltage source 106 past the reliability limit. Accordingly, as shown in FIG. 6, at least some embodiments may comprise a body bias (BB) mechanism 600 used to increase the target frequency of the reflex module 104 (and thus the operational frequency of the sub-chip logic 102) past the maximum frequencies imposed by the reliability limit.

Referring to FIG. 6, the BB mechanism 600 comprises multiplexers 602, 604 and voltage sources 620, 622, 632. In at least some embodiments, the multiplexer 602 comprises three voltage input connections 610, 612, 614, an enabling connection 616, and an output connection 618. The voltage input connection 610 is coupled to the voltage source 106. The voltage input connection 612 is coupled to a voltage source 620. The voltage input connection 614 is coupled to a voltage source 622. In some embodiments, because only one of the voltage input connections 612, 614 is used at a time, the voltage input connections 612, 614 may be coupled to a single voltage source, for example to voltage source 620. The multiplexer 602 is controlled by the enabling connection 616. The status of the enabling connection 616 may be controlled by any suitable mechanism, such as, for example, some circuit logic running a software application (neither one specifically shown). As shown, the output connection 618 is coupled to the reflex module 104 and the sub-chip logic 102, thus indicating that the output connection 618 preferably is coupled to most or all of the transistors found in the reflex module 104 and the sub-chip logic 102.

The multiplexer 604 comprises input connections 624, 626, an enabling connection 628 and an output connection 630. The input connection 624 is coupled to ground (i.e., a voltage of 0.0 volts). The input connection 626 is coupled to a voltage source 632. The enabling connection 628 preferably is coupled to the same mechanism to which the enabling connection 616 is coupled, such as the circuit logic running the aforementioned software application. The output connection 630 is coupled to the reflex module 104 and the sub-chip logic 102, thus indicating that the output connection 630 preferably is coupled to most or all of the transistors found in the reflex module 104 and the sub-chip logic 102.

As mentioned above, the BB mechanism 600 increases the target and operational frequencies of the reflex module 104 and the sub-chip logic 102, respectively, without increasing the voltage supplied to the module 104 and/or the logic 102. In some embodiments, the BB mechanism 600 accomplishes this by applying a forward body bias to most or all of the transistors in the reflex module 104 and the sub-chip logic 102 to which the mechanism 600 is coupled.

FIG. 7 shows a logic 700 comprising an NMOS transistor 701 coupled to a PMOS transistor 703. The logic 700 comprises generic transistors that are illustrative of any of the transistors located in the sub-chip logic 102 and/or the reflex module 104. The precise designs of some of the transistors in the sub-chip logic 102 and/or the reflex module 104 may vary from the design of the transistors 701, 703. In such cases, the voltage connections made to the either transistor 701, 703 may be adapted to suit a particular transistor.

In any case, the BB mechanism 600 applies a forward body bias to illustrative logic 700 (and thus to most or all transistors to which the mechanism 600 is coupled) by applying voltages to the substrates (not specifically shown) of the PMOS and NMOS portions of the logic 700. Specifically, the output connection 618 of the multiplexer 602 is coupled to the substrate (e.g., n-substrate) of the PMOS of the logic 700, and the output connection 630 of the multiplexer 604 is coupled to the substrate (e.g., p-substrate) of the NMOS of the logic 700. Thus, whichever multiplexer 602 input connection is coupled to the output connection 618 (i.e., by the enabling connection 616) also is coupled to the PMOS of the logic 700 (and thus to most or all of the PMOS transistors to which the BB mechanism 600 is coupled). Similarly, whichever multiplexer 604 input connection is coupled to the output connection 630 (i.e., by the enabling connection 628) also is coupled to the NMOS of the logic 700 (and thus to most or all of the NMOS transistors to which the BB mechanism 600 is coupled).

A forward body bias is applied to the logic 700 by applying a higher-than-usual voltage to the substrate of the NMOS of the logic 700 and further by applying a lower-than-usual voltage to the substrate of the PMOS of the logic 700. In some embodiments, the input connection 610 is coupled to the voltage source 106 and provides the multiplexer 602 with the voltage from the voltage source 106. The input connection 612 is coupled to the voltage source 620, which voltage source 620 provides a voltage lower than that provided by the voltage source 106. The voltage provided by the voltage source 620 preferably is about 0.8 V. The third input connection 614 is coupled to the voltage source 622, which voltage source 622 provides a voltage higher than that provided by the voltage source 106. The voltage provided by the voltage source 622 preferably is 1.8 V. Similarly, the input connection 624 of the multiplexer 604 is coupled to ground and preferably has a voltage of 0.0 V. The voltage provided by the voltage source 632 via the input connection 626 is greater than that provided via input connection 624. The voltage provided by voltage source 632 preferably is about 0.3 V. The scope of disclosure is not limited to providing a particular voltage(s) from the voltage sources 106, 620, 622 and/or 632. Instead, each voltage provided may be adjusted as desired to achieve optimum or at least improved performance in a particular system.

Thus, because a forward body bias is applied to the logic 700 by applying a higher-than-usual voltage to the NMOS of the logic 700 and further by applying a lower-than-usual voltage to the PMOS of the logic 700, the software application or other mechanism used to control the multiplexer 602 may be manipulated to allow the output connection 618 of the multiplexer 602 to receive the lower-than-usual voltage provided by input connection 612 (i.e., 0.8 V from voltage source 620). Similarly, a higher-than-usual voltage is applied to the NMOS of the logic 700 by coupling the NMOS to the output connection 630 of the multiplexer 604, which output connection 630 is coupled to the higher-than-usual voltage of 0.3 V (produced by voltage source 632) by the aforementioned software application or other suitable mechanism.

By applying a forward body bias to the exemplary logic 700, and thus to some or all of the transistors in the sub-chip logic 102 and/or the reflex module 104 to which the BB mechanism 600 is coupled, the frequency at which the transistors of the logic 700 perform, for a given input voltage, is increased. By increasing transistor frequency without increasing the voltage provided to the logic 700, performance is improved and stability is maintained. In at least some embodiments, applying a forward body bias voltage (i.e., higher-than-usual voltage) to the PMOS of a Static Random Access Memory (SRAM) Array transistor (not specifically shown) may not provide a significant performance benefit. Thus, in these embodiments, the voltage applied to the PMOS is the voltage provided by the voltage source 106 via input connection 610.

FIG. 8 shows graphs 800, 802 similar to the graphs 500, 502 of FIG. 5, respectively. One difference between the graphs of FIG. 8 and the graphs of FIG. 5 is the addition of the lines 804, 806 in the graphs 800, 802, respectively. The lines 804, 806 indicate the improved performance of the sub-chip logic 102 and the reflex module 104 after forward body bias is applied to some or all of the transistors in the sub-chip logic 102 and the reflex module 104. The graphs 500, 502 indicate that a given voltage of $V_2$ at the reliability limit may produce a maximum reflex module target frequency of $F_{T2}$ and a maximum sub-chip logic 102 operational frequency of $F_{SC2}$. In contrast, the lines 804, 806 in the graphs 800, 802 indicate that for the same voltage $V_2$ provided by the voltage source 106 at the reliability limit, a greater frequency $F_{SC3}$ may be achieved by the sub-chip logic 102 in comparison to that achieved by the logic 102 in graph 500, and a greater frequency $F_{T3}$ may be achieved by the reflex module 104 in comparison to that achieved by the reflex module 104 in graph 502. Similar performance benefits are obtained at different input voltages, as shown by lines 804, 806.

Referring again to FIGS. 6 and 7, while applying forward body bias as described above may improve performance, the technique also may incur a leakage problem. Accordingly, in embodiments which do not require high-frequency operation, leakage may be minimized by applying a reverse body bias to the PMOS portions of the exemplary logic 700 (and thus, to most or all of the PMOS transistors in the sub-chip logic 102 and the reflex module 104). Whereas forward body bias was applied to PMOS portions of transistors by coupling the output connection 618 of multiplexer 602 to the input connection 612 (i.e., the lower-than-usual voltage of 0.8 V), reverse body bias is applied to the PMOS transistors by coupling the output connection 618 of multiplexer 602 to the input connection 614 (i.e., the higher-than-usual voltage of 1.8 V). Because the "usual" bias voltage supplied to the NMOS transistors is ground (i.e., 0.0 V), the voltage is not decreased any further to provide a reverse body bias to the NMOS transistors. By applying a reverse body bias to the exemplary logic 700 (and thus to some or all of the transistors to which the BB mechanism 600 is coupled), performance frequency of the transistors is reduced, but leakage also is minimized.

The scope of disclosure is not limited to activating any particular combination of multiplexer 602, 604 inputs. Thus, a forward body bias may be applied to the PMOS of the logic 700 while a forward body bias is not applied to the NMOS of the logic 700. Similarly, a forward body bias may be applied to the NMOS of the logic 700 while a forward body bias is not applied to the PMOS of the logic 700. Further, any number of reflex modules 104 may be incorporated onto a single chip 100, each reflex module corresponding to a different BB mechanism 600. Thus, for example, a first set of transistors on the chip 100 may be controlled by a first reflex module and a first BB mechanism, while a second set of transistors on the chip 100 may be controlled by a second reflex module and a second BB mechanism. Also, the scope of disclosure is not limited to supplying a specific number of input voltages to either of the multiplexers 602, 604. In some embodiments, for instance, the multiplexer 604 may be supplied with a number of inputs that enables forward and reverse body biasing as well as no body biasing.

By using the BB mechanism 600 to selectively apply forward body bias and reverse body bias voltages to some or all transistors on the chip 100, and by using the reflex module 104 to monitor the performance level of transistors on the chip 100, the performance and stability levels of transistors on the chip 100 are increased over that of transistors on other chips. The techniques described above may be applied to circuit logic comprising silicon or other conducting material of any strength (e.g., strong silicon, weak silicon). For instance, the techniques described above may be selectively applied to silicon based on the silicon strength. For example, in a device comprising both weak and strong silicon, the weak silicon may be limiting the overall performance of the device, whereas the strong silicon is able to perform at a higher level than the weak silicon. Thus, a forward body bias may be applied to the weak silicon only, thus improving the performance of the weak silicon. By improving the performance of the weak silicon, which weak silicon is the limiting factor for the performance of the device, the overall performance of the device also is improved. These techniques may be selectively applied to weak silicon, nominal silicon and/or strong silicon, as desired. In broader terms, the above techniques may be customized to meet the specific needs of various devices or circuit logic. The specific implementation of the above techniques in a particular device may depend on a variety of factors, such as the use model (e.g., power usage and/or leakage) of the particular device. The scope of disclosure is not limited to implementing the above techniques in any particular fashion.

Figure 9A:
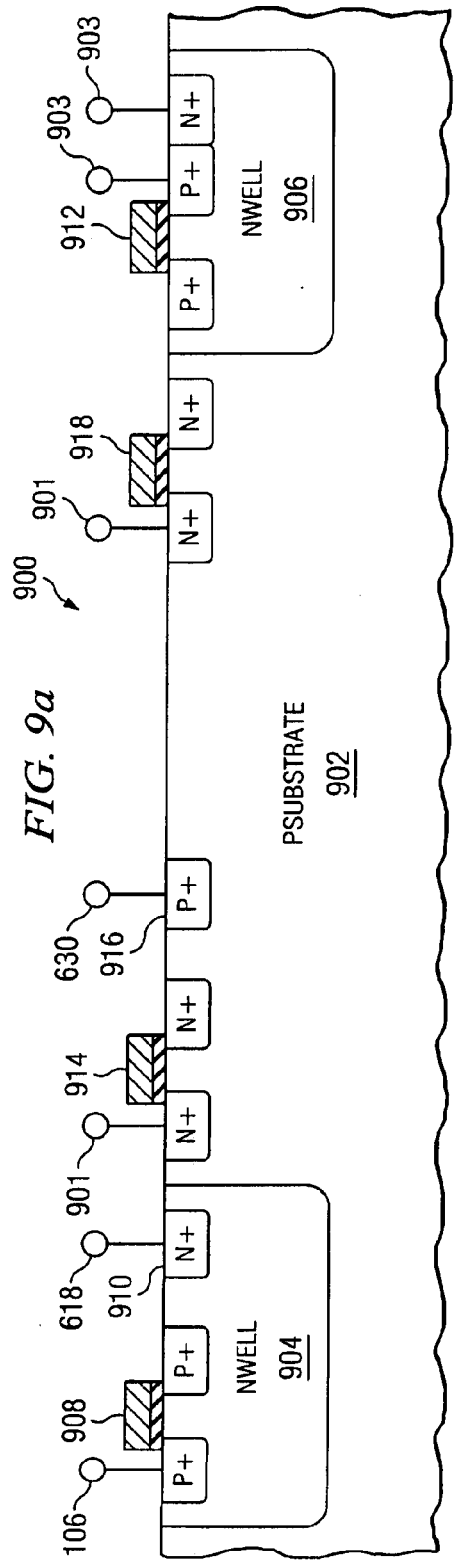
FIGS. 9a-9c show the implementation of a technique used to at least partially isolate an NMOS core from an NMOS input/output device, in accordance with embodiments of the invention.

A cross-sectional view of a logic 900 (e.g., a complementary metal oxide semiconductor, or CMOS) comprising an NMOS transistor and a PMOS transistor is shown in FIG. 9a. Specifically, the logic 900 comprises a p-substrate 902, an n-well 904, and another n-well 906. The n-well 904 comprises a PMOS core 908 and a PMOS body 910. The n-well 906 comprises a PMOS input/output (I/O) 912. The p-substrate 902 comprises an NMOS core 914, an NMOS body 916, and an NMOS I/O 918. The PMOS core 908 may couple to a connection to voltage source 106. The PMOS body 910 is coupled to connection 618. The NMOS body 916 is coupled to connection 630. Both the NMOS core 914 and the NMOS I/O 918 are coupled to voltage connection 901, which connection 901 also may be provided to the source connections of one or more NMOS transistors throughout the circuit paths 98. The PMOS I/O 912 is coupled to connection 903, which connection 903 serves as an input/output connection.

Figure 9B:
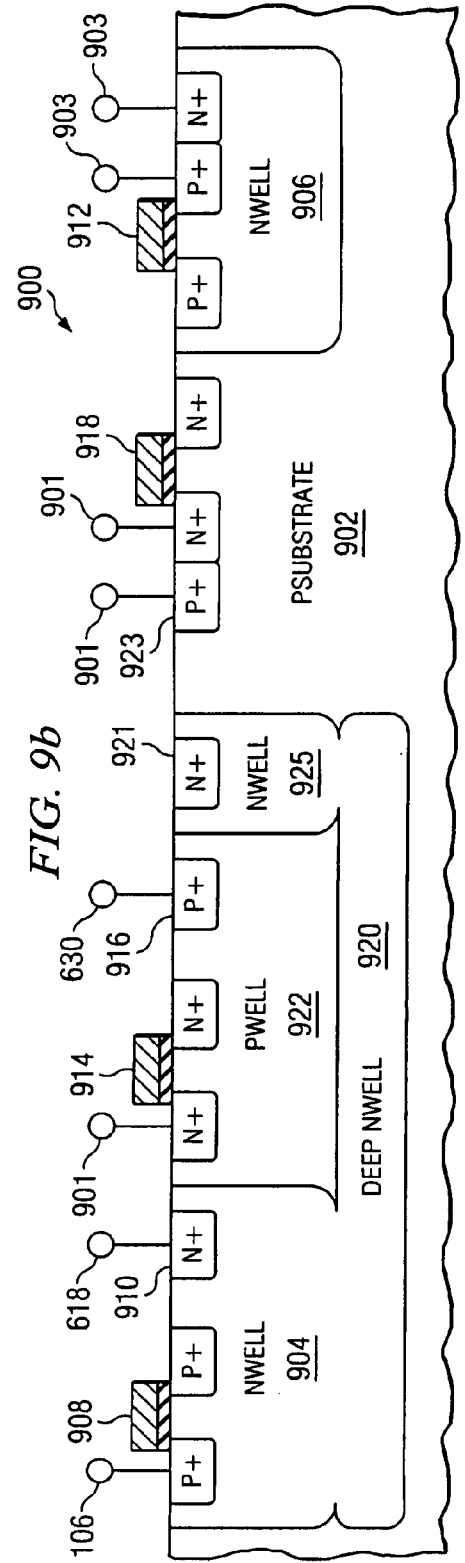
Figure 9C:
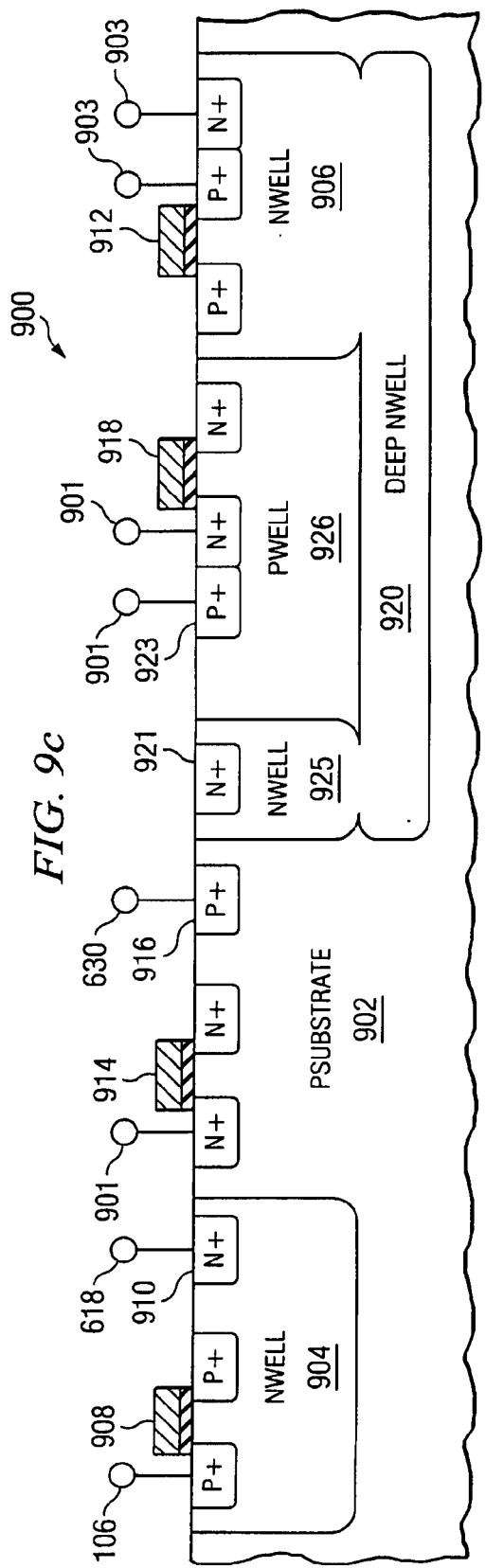

It is undesirable for the NMOS core 914 to be in contact with the NMOS I/O 918. Accordingly, in embodiments of the invention, the NMOS core 914 may be kept at least partially isolated from the NMOS I/O 918 using the techniques shown in FIGS. 9b and 9c, although the scope of disclosure is not limited to the embodiments shown in FIGS. 9b and 9c. In particular, FIG. 9b shows the logic 900 of FIG. 9a modified with the addition of a deep n-well 920 and additional contacts 921, 923, which contact 923 preferably is coupled to connection 901. The contact 921 is coupled to the logic 900 via an additional n-well 925. The deep n-well 920 couples the n-well 904 to the n-well 925, thus forming a p-well 922 therebetween. The p-well 922 is at least partially isolated from the p-substrate 902, and thus the NMOS core 914 is at least partially isolated from the NMOS I/O 918. Another embodiment of such a technique is shown in FIG. 9c, in which the logic 900 is somewhat similar to that of FIG. 9b, except the deep n-well 920 couples the additional n-well 925 to the n-well 906, thus forming a p-well 926 therebetween. The p-well 926 is at least partially isolated from the p-substrate 902, thus at least partially isolating the NMOS core 914 from the NMOS I/O 918.

The above discussion is meant to be illustrative of the principles and various embodiments of the present invention. Numerous variations and modifications will become apparent to those skilled in the art once the above disclosure is fully appreciated. For example, as previously discussed, although the above embodiments are described in context of a NAND/NOR oscillator system, other tracking elements that reflect the performance of an associated circuit path or critical path may be substituted for the NAND and NOR oscillators. In some embodiments, more than two tracking elements may be used. For example, different tracking elements may be used to surmise the performance of NMOS, PMOS, Hi-$V_t$ PMOS, Lo-$V_t$ PMOS, Hi-$V_t$ NMOS and Lo-$V_t$ NMOS components. In at least some embodiments, the tracking elements may be designed to be substantially sensitive to variations in process, voltage and temperature, thus ensuring that the tracking elements embody the worst-case performance scenarios for critical paths associated with the tracking elements. Also, although the embodiments above are discussed in terms of oscillators, oscillating frequencies and target frequencies, other tracking elements and other performance parameters besides frequency also may be used. It is intended that the following claims be interpreted to embrace all such variations and modifications.

What is claimed is:

1. A device for adaptively controlling a voltage output supplied to circuitry in close proximity to the device, comprising:

a processing module;

a first tracking element coupled to the processing module and producing a first value indicative of a first estimated speed associated with the circuitry; and a second tracking element coupled to the processing module and producing a second value indicative of a second estimated speed associated with the circuitry;

wherein the processing module compares each of the first and second values to respective target values and causes the voltage output to be adjusted based on said comparisons;

wherein the first and second tracking elements comprise a plurality of transistors, at least some of said transistors selectively provided with a transistor bias voltage to adjust transistor speed;

wherein at least one of the first and second tracking elements is more sensitive to environmental operating conditions than is the circuitry.

2. The device of claim 1, wherein selectively providing at least some of the transistors with the transistor bias voltage comprises applying a forward body bias to said at least some of the transistors.

3. The device of claim 1, wherein selectively providing at least some of the transistors with the transistor bias voltage comprises applying a reverse body bias to said at least some of the transistors.

4. The device of claim 1, wherein the transistor bias voltage is selected by a software program from a group of bias voltages input into a multiplexer.

5. The device of claim 1, wherein one of said transistors is provided with the transistor bias voltage and another transistor is provided with another transistor bias voltage, said transistor bias voltage provided from a voltage source via a multiplexer and the another transistor bias voltage provided from another voltage source via another multiplexer.

6. The device of claim 1, wherein selectively providing the transistor bias voltage comprises decreasing the transistor bias voltage provided to the at least some of said transistors to reduce transistor power leakage.

7. The device of claim 1, wherein selectively providing the transistor bias voltage comprises increasing the transistor bias voltage provided to the at least some of said transistors to increase transistor speed.

8. The device of claim 1, wherein at least one of the first and second tracking elements is subjected to at least some operating conditions to which the circuitry is exposed.

9. The device of claim 1, wherein at least one of the first, second and target values is a frequency value.

10. The device of claim 1, wherein at least one of the tracking elements is selected from a group consisting of NAND oscillators and NOR oscillators.

11. A chip, comprising:
a circuit comprising a plurality of circuit paths and receiving a voltage source output from a voltage source; and
a module external to the circuit, coupled to the voltage source, and comprising a first tracking element and a second tracking element, said module subjected to substantially similar operating conditions as the circuit;
wherein the module adjusts the voltage source output based on a value generated by at least one of the first and second tracking elements;
wherein the circuit paths and the first and second tracking elements comprise a plurality of transistors, at least some of said transistors selectively provided a transistor bias voltage to adjust speeds of said at least some of said transistors;
wherein at least one of the tracking elements is more sensitive to environmental operating conditions than is the circuit.

12. The chip of claim 11, wherein said transistor bias voltage is provided by a different voltage source via a multiplexer controlled by a software application.

13. The chip of claim 11, wherein one of said transistors is provided with the transistor bias voltage and another transistor is provided with another transistor bias voltage, said transistor bias voltage provided from a first voltage source via a multiplexer and the another transistor bias voltage provided from a second voltage source via another multiplexer.

14. The chip of claim 11, wherein selectively providing the transistor bias voltage to the at least some of said transistors comprises applying a forward body bias to the at least some of said transistors.

15. The chip of claim 11, wherein selectively providing the transistor bias voltage to the at least some of said transistors comprises applying a reverse body bias to the at least some of said transistors.

16. The chip of claim 11, wherein selectively providing the transistor bias voltage comprises increasing the transistor bias voltage to increase the speed of the at least some of said transistors.

17. The chip of claim 16, wherein the at least some of said transistors comprise NMOS transistors.

18. The chip of claim 11, wherein selectively providing the transistor bias voltage comprises increasing the transistor bias voltage to decrease power leakage of the at least some of said transistors.

19. The chip of claim 18, wherein the at least some of said transistors comprise PMOS transistors.

20. The chip of claim 11, wherein at least one of the tracking elements comprises an oscillator.

21. The chip of claim 11, wherein at least one transistor of the plurality of transistors comprises an NMOS input/output (I/O) and an NMOS core, one of said NMOS I/O and NMOS core coupled to a p-well and the other of said NMOS I/O and NMOS core coupled to a p-substrate, said p-substrate at least partially isolated from the p-well by an n-well.

22. A method, comprising:
determining a first frequency ratio of a first frequency associated with a first tracking element to a first target reference frequency;
determining a second frequency ratio of a second frequency associated with a second tracking element to a second target reference frequency; and
based on said frequency ratios, adjusting a voltage that is output by a voltage source to a circuit associated with the first and second tracking elements;
wherein the first and second tracking elements comprise a plurality of transistors, at least some of said transistors selectively provided with a transistor bias voltage to adjust speeds of the at least some of said transistors;
wherein at least one of the first and second tracking elements is more sensitive to environmental operating conditions than is the circuit.

23. The method of claim 22, wherein the transistor bias voltage is selectively provided via a multiplexer.

24. The method of claim 22, wherein selectively providing the transistor bias voltage comprises applying a forward body bias to the at least some of said transistors.

25. The method of claim 22, wherein selectively providing the transistor bias voltage comprises applying a reverse body bias to the at least some of said transistors.

26. The method of claim 22, wherein selectively providing the transistor bias voltage comprises selectively applying a body bias to the at least some of said transistors based on a strength of silicon present in the at least some of said transistors.

* * * * *